(12) United States Patent
Hill

(10) Patent No.: US 7,737,047 B2
(45) Date of Patent: Jun. 15, 2010

(54) SEMICONDUCTOR CONSTRUCTIONS, AND METHODS OF FORMING DIELECTRIC MATERIALS

(75) Inventor: Christopher W. Hill, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 219 days.

(21) Appl. No.: 11/510,025

(22) Filed: Aug. 25, 2006

(65) Prior Publication Data

US 2008/0050928 A1  Feb. 28, 2008

(51) Int. Cl.
*H01L 21/31* (2006.01)

(52) U.S. Cl. .................. 438/762; 438/761; 438/765; 257/E21.576

(58) Field of Classification Search .............. 438/761, 438/762, 765; 257/E21.576
See application file for complete search history.

(56) References Cited

U.S. PATENT DOCUMENTS

| | | | |
|---|---|---|---|
| 6,969,539 B2 | 11/2005 | Gordon et al. | |
| 7,053,010 B2 | 5/2006 | Li et al. | |
| 7,166,544 B2 * | 1/2007 | Padhi et al. | 438/778 |
| 7,202,185 B1 * | 4/2007 | Hausmann et al. | 438/778 |
| 2005/0054213 A1 * | 3/2005 | Derderian et al. | 438/778 |
| 2005/0112282 A1 * | 5/2005 | Gordon et al. | 427/255.18 |
| 2005/0277780 A1 * | 12/2005 | Gordon et al. | 556/57 |
| 2006/0046518 A1 | 3/2006 | Hill et al. | |
| 2008/0000875 A1 * | 1/2008 | Ramachandrarao et al. | 216/56 |

OTHER PUBLICATIONS

Hausmann, et al., "Rapid Vapor Deposition of Highly Conformal Silica Nanolaminates", Science Magazine, vol. 298, Oct. 11, 2002, pp. 402-406.

* cited by examiner

Primary Examiner—Davienne Monbleau
Assistant Examiner—Hajar Kolahdouzan
(74) Attorney, Agent, or Firm—Wells St. John, P.S.

(57) ABSTRACT

Some embodiments include methods of forming dielectric materials associated with semiconductor constructions. A semiconductor substrate surface having two different compositions may be exposed to a first silanol, then to organoaluminum to form a monolayer, and finally to a second silanol to form a dielectric material containing aluminum from the organoaluminum together with silicon and oxygen from the second silanol. Alternatively, or additionally, an organoaluminum monolayer may be formed across a semiconductor substrate, and then exposed to silanol within a deposition chamber, with the silanol being provided in two doses. Initially, a first dose of the silanol is injected the chamber, and then the first dose is flushed from the chamber to remove substantially all unreacted silanol from within the chamber. Subsequently, the second dose of silanol is injected into the chamber. Some embodiments include semiconductor constructions.

29 Claims, 7 Drawing Sheets

US 7,737,047 B2

SEMICONDUCTOR CONSTRUCTIONS, AND METHODS OF FORMING DIELECTRIC MATERIALS

TECHNICAL FIELD

The technical field pertains to semiconductor constructions, and to methods of forming dielectric materials associated with semiconductor constructions.

BACKGROUND

Electrically insulative materials (in other words, dielectric materials) are widely used in semiconductor fabrication to electrically isolate various electrical components from one another. Devices that extend into a semiconductor substrate may be electrically isolated by trenched isolation regions formed within the substrate between the components. In such technique, trenches are etched into a semiconductor substrate (such as a silicon substrate); and the trenches are subsequently filled with dielectric material (such as silicon dioxide).

Various methods have been developed for depositing dielectric materials across semiconductor substrates. Such methods include chemical vapor deposition (CVD) processes and atomic layer deposition (ALD) processes. ALD processes are generally processes in which precursor materials react at a surface, rather than in a vapor phase above the surface. In contrast, CVD processes are generally processes in which precursor materials react in a vapor phase above the surface to form the deposit that ultimately accumulates on the surface. ALD processes will generally be characterized by successive, controlled formation of monolayers across a substrate surface, with the monolayers building up to form the desired deposit to a desired thickness. CVD process will not comprise controlled formation of monolayers, and instead will form a thick bulk deposit across a substrate surface in a single deposition step.

An advantage of CVD is that it is relatively rapid, and accordingly may be utilized to achieve high throughput of wafers through a fabrication process. A disadvantage of CVD is that it tends to lead to relatively poor uniformity of deposition across a substrate. In contrast, an advantage of ALD is that it may accomplish relatively good uniformity of deposition across a substrate, and a disadvantage of some ALD processes is that they tend to be slow and accordingly associated with low throughput of wafers through a fabrication process. It is desired to develop processes having the good uniformity associated with ALD, while also allowing relatively high throughput of wafers through a fabrication process.

DETAILED DESCRIPTION OF THE ILLUSTRATED EMBODIMENTS

Embodiments may include improvements on so-called pulse deposition layer (PDL) methods of forming dielectric material. A PDL method may comprise formation of a monolayer of organoaluminum material across a substrate, followed by exposure of the monolayer to silanol to form a dielectric material. A problem with conventional PDL methodology is that dielectric materials deposited by such methodology may lack desired uniformity across a semiconductor wafer.

Two embodiments are shown and described with reference to the accompanying drawings. The embodiments may be utilized separately or in combination. The embodiments may lead to improved uniformity of a deposited dielectric material relative to conventional PDL methodology. One embodiment is described with reference to FIGS. 1-7, and includes pretreatment of a surface of a semiconductor substrate with silanol prior to formation of the monolayer of organoaluminum material. The other embodiment is described with reference to FIGS. 8-14, and includes utilization of two separate doses of silanol after formation of the monolayer.

Figure 1:
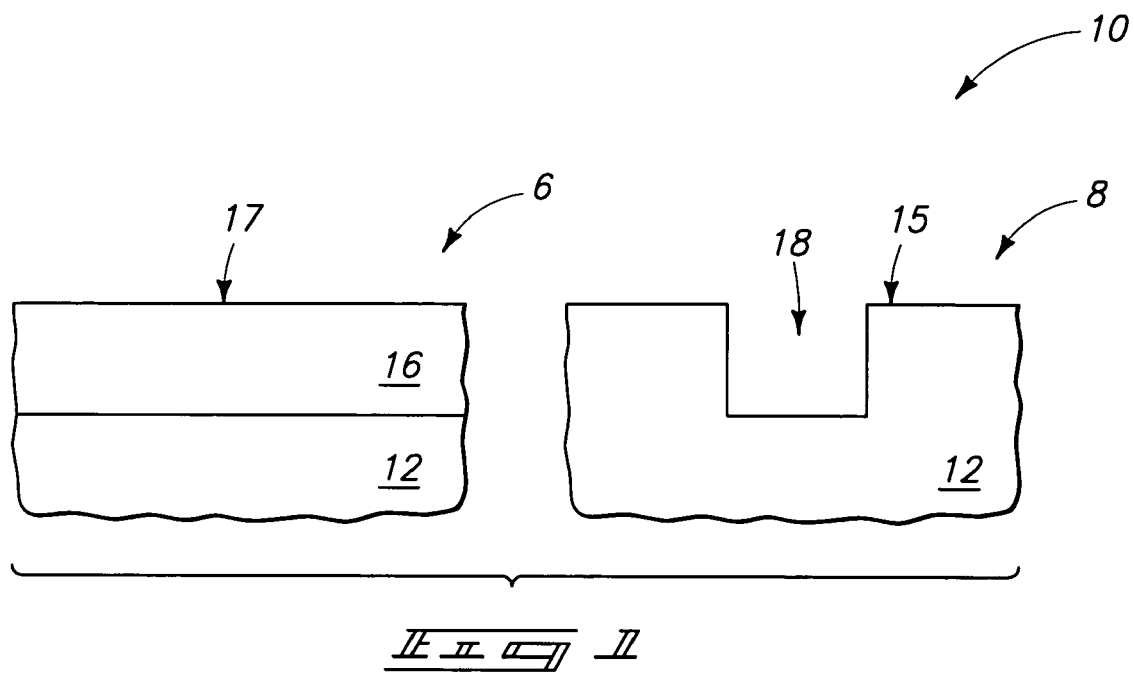
FIG. 1 is a diagrammatic, cross-sectional view of a pair of fragments of a semiconductor wafer shown at a preliminary processing stage of an embodiment.

Referring to FIG. 1, such illustrates a semiconductor construction 10. Specifically, a pair of fragments 6 and 8 of the construction are shown. The semiconductor construction comprises a base 12. The base may comprise, consist essentially of, or consist of, for example, monocrystalline silicon lightly-doped with background p-type dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

The fragment 6 comprises a material 16 over base 12, and comprises an upper surface 17 corresponding to the upper surface of material 16. Material 16 may comprise any of numerous compositions or combinations of compositions; and may, for example, comprise, consist essentially of, or consist of silicon nitride, silicon dioxide, or silicon oxynitride. Accordingly, upper surface 17 may comprise, consist essentially of, or consist of silicon nitride, silicon dioxide, or silicon oxynitride.

The fragment 8 comprises an upper surface 15 corresponding to the composition of base 12. Accordingly, upper surface 15 may comprise, consist essentially of, or consist of monocrystalline silicon, either alone, or with dopant therein.

An opening 18 is shown extending into base 12 of fragment 8. The opening may be formed to any desired depth, and may correspond to a trench within which dielectric material is to be deposited to form a trenched isolation region.

Construction 10 may be considered to comprise an upper topography that extends across surfaces 15 and 17. Such topography comprises two different exposed compositions, with one of the compositions corresponding to the composition of surface 15 and the other corresponding to the composition of surface 17. It is to be understood that the diagrammatic illustration of FIG. 1 illustrates one of numerous constructions containing an upper topography with two different exposed surface compositions. For instance, native oxide (not shown) may extend across exposed surfaces of base material 12, and construction 10 will still have a different surface composition across fragment 8 than across fragment 6 if upper surface 17 of fragment 6 comprises a composition other than silicon dioxide. Further, although only two different exposed surface compositions are illustrated, it is to be understood that the construction may have more than two different exposed surface compositions. For instance, three or more compositions selected from the group consisting of photoresist, silicon nitride, silicon oxynitride, silicon dioxide, doped silicon and undoped silicon may be exposed across construction 10. The doped and/or undoped silicon may be amorphous, polycrystalline and/or monocrystalline.

Figure 2:
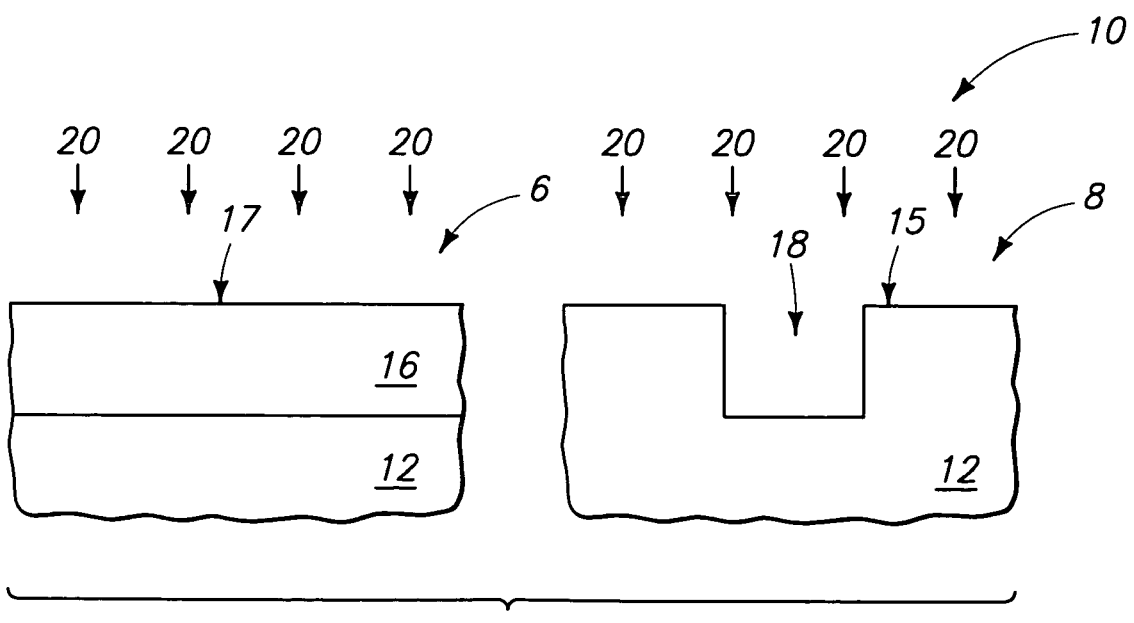
FIG. 2 is a view of the FIG. 1 fragments shown at a processing stage subsequent to that of FIG. 1.

Referring to FIG. 2, surfaces 15 and 17 of construction 10 are exposed to silanol 20. The silanol may be a single silanol composition or a combination of silanol compositions; and may, for example, include one or more of alkoxysilanols, alkoxyalkylsilanols, alkoxysilanediols, and the like. Example silanols include tris(alkoxy)silanol compounds, such as, for example, tris(tert-butoxy)silanol (TBOS) and tris(tert-pentoxy)silanol (TPOS); and include diols, such as, for example, bis(tert-alkoxy)silanediol.

Construction 10 may be placed within a deposition chamber and exposed to a dose of silanol 20 for a time of less than or equal to about 60 seconds, (such as, for a time of less than or equal to about one second). The exposure to the dose of silanol may be conducted by initially providing a desired dose within the deposition chamber, and then holding the chamber static for a desired time (a so-called soak time). If the exposure is less than one second, the dose may be flowed through the chamber so that there is effectively no soak time.

Figure 15:
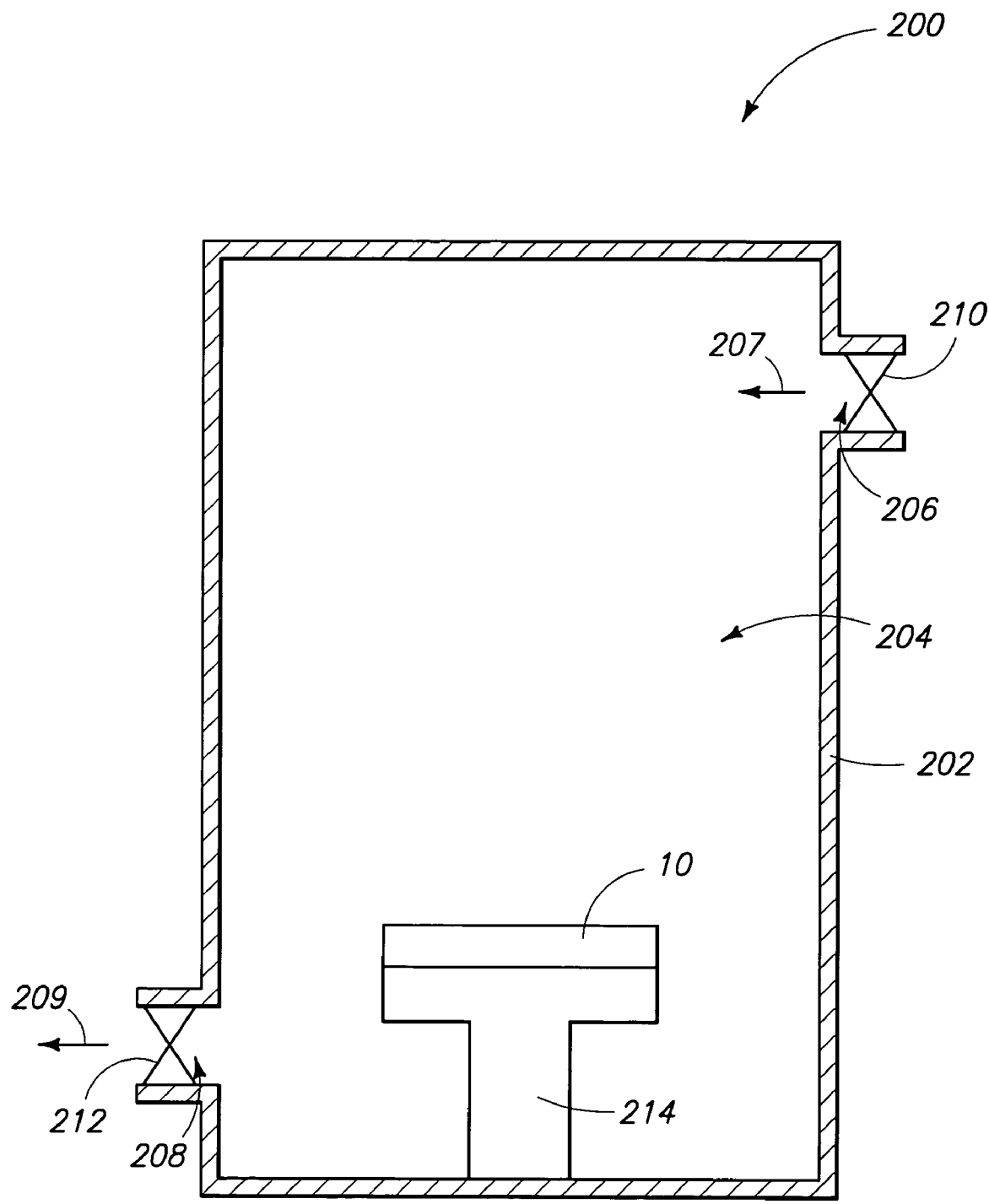
FIG. 15 is a diagrammatic, cross-sectional view of a deposition chamber which may be utilized in some embodiments.

An example chamber is diagrammatically illustrated in FIG. 15 as part of a deposition apparatus 200. Specifically, the apparatus 200 is shown to comprise a sidewall 202 which surrounds a deposition chamber 204. A pair of openings 206 and 208 are shown extending through the sidewall. The openings correspond to an inlet and an outlet, respectively, and flow of material through the inlet and outlet is diagrammatically illustrated by arrows 207 and 209.

A valve 210 is diagrammatically illustrated across opening 206, and another valve 212 is diagrammatically illustrated across opening 208.

The deposition apparatus 200 comprises a substrate holder 214. A substrate construction 10 is diagrammatically illustrated as being supported by holder 214.

In operation, a desired material is flowed into chamber 200 to expose an upper surface of construction 10 to such material. Valves 210 and 212 are utilized to control flow of material into and out of the chamber so that construction 10 is exposed to a desired composition and concentration of material for a desired time. As discussed above, the silanol pretreatment may or may not comprise a soak. If the pretreatment is conducted with a soak, an initial dose of silanol is flowed into chamber 204; then the inlet valve 210 is closed and the chamber held static for the soak time; and finally, after the desired soak time valves 210 and 212 are adjusted to purge any unreacted silanol from the chamber. The purging may be conducted utilizing a pump to withdraw unreacted silanol from the chamber and/or utilizing a purge gas to flush unreacted silanol from the chamber.

The chamber may, for example, have an internal volume of 1 liter, and the dose of silanol may be from about 5 micromoles to about 300 micromoles; and may, for example, be about 20 micromoles (for instance, about 22 micromoles). The dose may comprise one or more silanols. In some applications, the silanol of the dose may comprise, consist essentially of, or consist of one or both of TPOS and TBOS.

The silanol dose may be pulsed into the deposition chamber in an inert carrier gas (e.g., $N_2$, He, Ar, etc.) at a silanol flow rate of about 100-500 standard cubic centimeters per minute (sccm), (such as, for example, about 300 sccm), a reaction chamber temperature of from about 90° C. to about 350° C., (such as, for example, from about 200° C. to about 320° C., and may be about 230° C.); and a chamber pressure of from about 0.5 Torr to about 10 Torr, (such as, for example, about 1 Torr). The silanol may be delivered into the reaction chamber by known methods, including, for example, by vaporizing the silanol in an ampoule or bubbler at a temperature of from about 70° C. to about 100° C., (such as, for example, about 80° C.); and introducing the vaporized silanol in combination with a carrier gas into the chamber.

Figure 3:
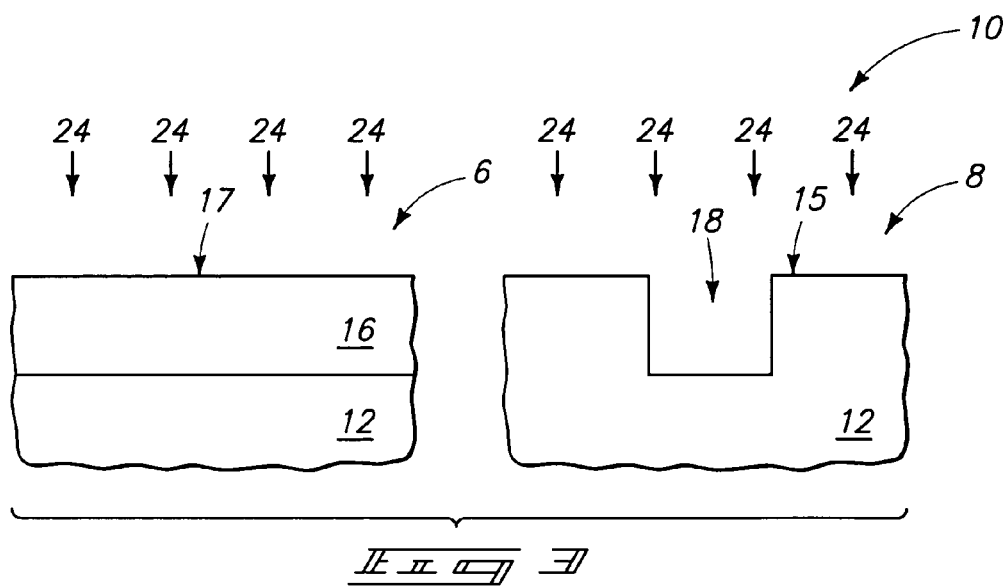
FIG. 3 is a view of the FIG. 1 fragments shown at a processing stage subsequent to that of FIG. 2.

After the silanol pretreatment of exposed surfaces of construction 10, the silanol is evacuated from the deposition chamber. Subsequently, as shown in FIG. 3, construction 10 is exposed to at least one organoaluminum composition (or material) 24. The organoaluminum composition may be any suitable organic compound that will allow the aluminum to deposit under ALD conditions and chemisorb to the surface of the substrate with organic groups (e.g., methyl groups) available for oxidation. Example organoaluminum compositions include aluminum alkyls such as trimethylaluminum (TMA), triethylaluminum, triisobutylaluminum, and the like; alkylaluminum alkoxides such as triethyl(tri-sec-butoxy)dialuminum (TETBAL), and the like; and aluminum amides such as $Al_2(NEt_2)_6$, $Al_2(NEtMe)_6$, $Al_2(NMe_2)_6$, and the like. The ALD deposition may be referred to as a deposition process comprising conditions suitable for formation of an atomic layer.

Figure 4:
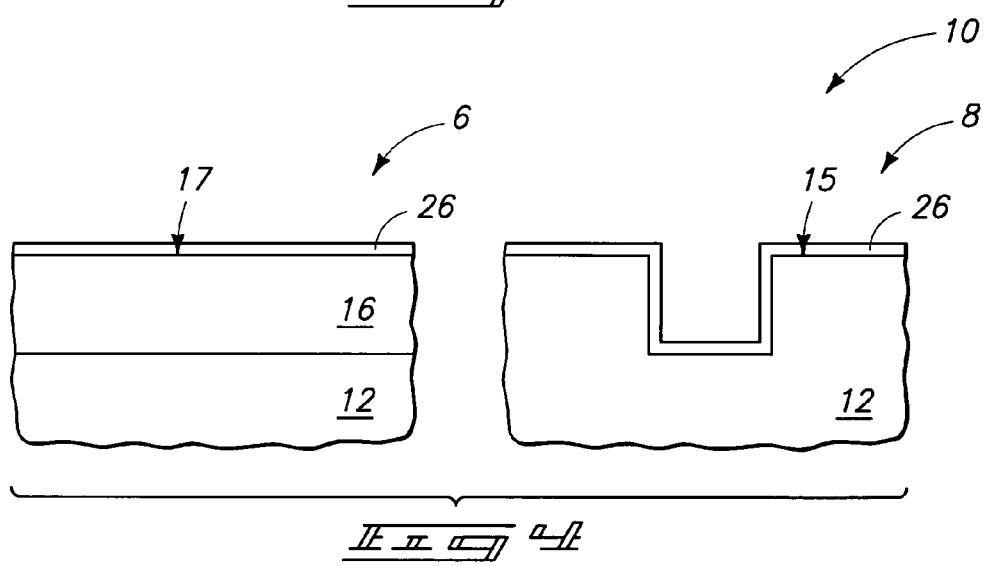
FIG. 4 is a view of the FIG. 1 fragments shown at a processing stage subsequent to that of FIG. 3.

The exposure to the organoaluminum composition forms an organoaluminum-comprising layer 26 across surfaces 15 and 17, as shown in FIG. 4. Such organoaluminum-comprising layer may be a monolayer; may comprise, consist essentially of, or consist of carbon, aluminum and hydrogen; and may further include one or both of nitrogen and oxygen.

A conventional ALD process may be used during the FIG. 3 exposure to form the monolayer 26 of FIG. 4. Such ALD process may be conducted in the chamber 200 of FIG. 15, and may utilize delivery of an organoaluminum composition from a vaporization chamber (not shown) to the deposition chamber. The organoaluminum composition may be vaporized by known methods. For example, a liquid form of the organoaluminum composition may be placed in a bubbler and heated (if necessary) to its vaporization temperature, and the vaporized organoaluminum composition may then be either directly introduced into the deposition chamber, or transported by a carrier gas (e.g., Ar, He, etc.).

Example conditions for forming the organoaluminum-comprising layer 26 may include a deposition chamber temperature of from about 90° C. to about 350° C., (such as, for example, from about 200° C. to about 320° C., such as about 230° C.); and a chamber pressure of from about 0.5 Torr to about 10 Torr, (such as, for example, about 1 Torr). The cycle duration (pulsing) of the organoaluminum precursor (e.g., trimethylaluminum) may be from about 1 second to about 5 seconds (such as, for example, about 1 second), to deposit a monolayer of organoaluminum substance onto the surfaces of the construction 10.

After formation of layer 26, unreacted organoaluminum composition is purged from the deposition chamber. The purging may be conducted with an inert gas such as nitrogen ($N_2$), argon (Ar), helium (He), neon (Ne), Krypton (Kr), xenon (Xe), and the like, at a flow rate of from about 500 sccm to about 1,000 sccm, for a time of from about 1 second to about 30 seconds, (such as, for example, a time of about 10 seconds).

Figure 5:
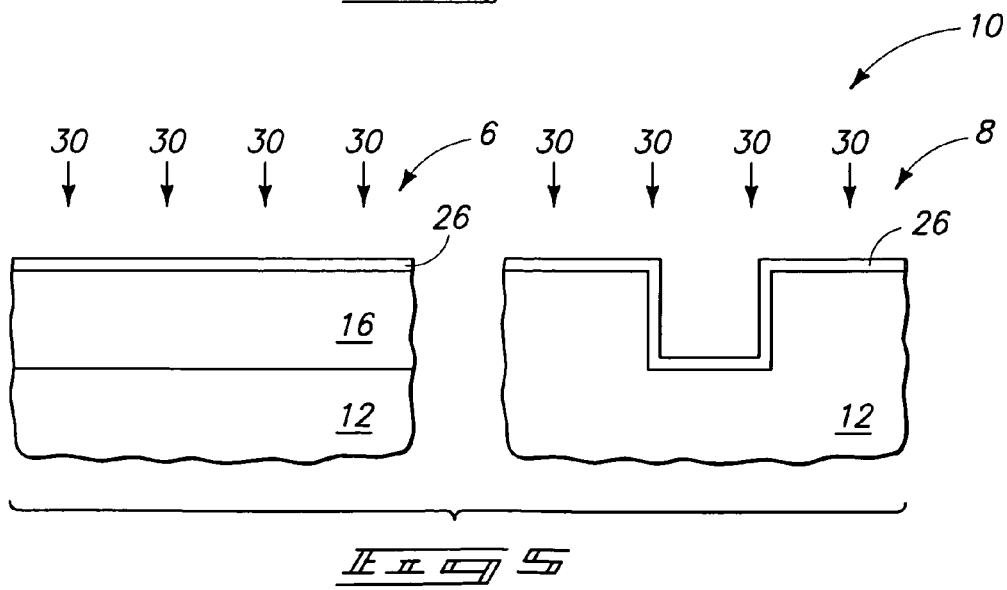
FIG. 5 is a view of the FIG. 1 fragments shown at a processing stage subsequent to that of FIG. 4.
Figure 6:
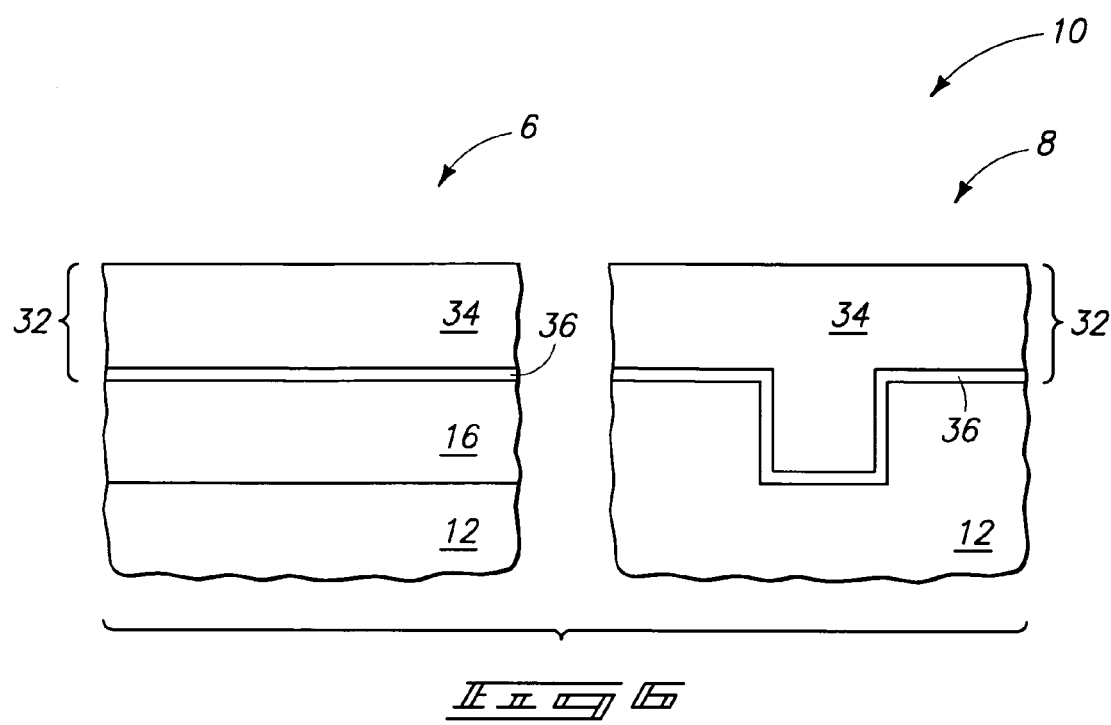
FIG. 6 is a view of the FIG. 1 fragments shown at a processing stage subsequent to that of FIG. 5.

Referring next to FIGS. 5 and 6, the organoaluminum-comprising layer 26 is exposed to at least one silanol 30 to form a dielectric material 32. The shown dielectric material comprises an upper portion 34 and a lower portion 36. The lower portion 36 may comprise aluminum from the organoaluminum-comprising layer together with silicon and oxygen from the silanol; and the upper portion may consist essentially of, or consist of silicon and oxygen from the silanol. The two portions 34 and 36 may result if there is enough exposure to silanol to cause dielectric material 32 to be formed much thicker than the original organoaluminum-comprising layer 36, and if aluminum from layer 26 (FIG. 5) does not uniformly distribute throughout dielectric 32. Alternatively, dielectric 32 may be formed to substantially homogeneously comprise a mixture of aluminum from layer 26 together with silicon and oxygen from the silanol.

The exposure to the silanol of FIG. 5 for dielectric material growth may comprise processing similar to that discussed above relative to the pretreatment of FIG. 2, or may comprise a higher dose than the pretreatment for a longer soak time. The silanol exposure of FIG. 5 may utilize silanols identical to those discussed above for the pretreatment of FIG. 2. The silanol utilized for the pretreatment may be referred to as a first silanol, and that utilized for the dielectric material growth may be referred to as a second silanol, to distinguish the silanol utilized at one processing stage from that utilized in another processing stage. The first and second silanols may be identical to one another, or different.

The silanol pretreatment of FIG. 2 may improve uniformity of dielectric material growth (in other words, growth of the material 32 of FIG. 6) relative to the uniformity which would occur in the absence of such pretreatment. For instance, it is found that if identical constructions are compared after growth of dielectric material 32, with one of the constructions being subjected to the silanol pretreatment and the other not, the construction that received the silanol pretreatment has a uniformity parameter (as measured as range/mean across a semiconductor wafer times 100) of less than or equal to about 4 percent (for instance, 3.7 percent), whereas the construction that did not receive the silanol pretreatment has a uniformity parameter of 37.2 percent (with the tested wafers being 200 millimeter wafers). In other words, the silanol pretreatment has provided in order of magnitude improvement in uniformity of the deposited dielectric material.

A possible mechanism by which the silanol pretreatment may improve the uniformity of the deposited dielectric material is that the silanol pretreatment provides a layer of OH groups across the various surface compositions of the construction. Such OH groups may react with organoaluminum materials to form a uniform monolayer across the various surfaces; whereas, without the pretreatment, there would be less uniformity of the number of OH groups across the various surface compositions, which would lead to less uniformity of the organoaluminum monolayer. This mechanism is provided to assist the reader in understanding the subject matter described herein, but is not to limit the claims that follow except to the extent, if any, that the mechanism is expressly recited in the claims.

Figure 7:
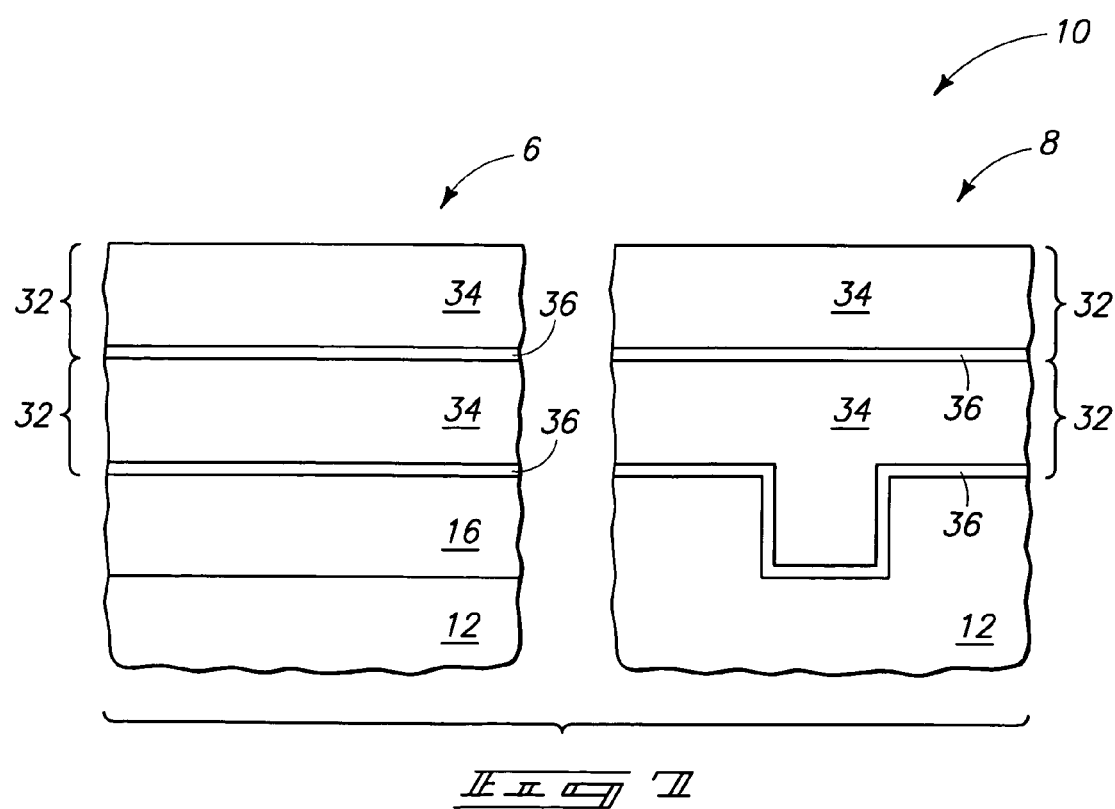
FIG. 7 is a view of the FIG. 1 fragments shown at a processing stage subsequent to that of FIG. 6.

Dielectric material 32 may be formed to a thickness of, for example, from about 500 angstroms to about 1000 angstroms, and then the growth of the dielectric material will substantially cease. If it is desired to form dielectric material 32 to be thicker, the processing described above may be repeated multiple times to form stacks of dielectric material 32 as shown in FIG. 7. However, once that a substrate is uniformly coated with dielectric material 32, the silanol pretreatment may be omitted during formation of subsequent sections of the stacks of dielectric material 32. Thus, some applications may include processing through FIG. 2, followed by one or more iterations of the processing of FIGS. 3-6 to form a dielectric material stack to a desired thickness.

Figure 8:
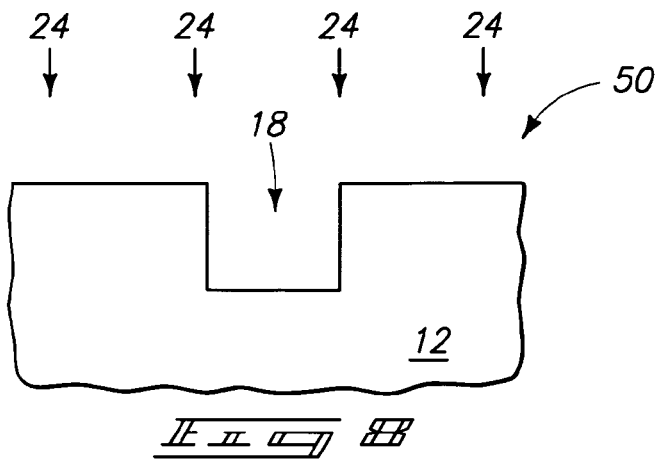
FIG. 8 is a diagrammatic, cross-sectional view of a fragment of a semiconductor wafer shown at a preliminary processing stage of another embodiment.

Referring next to FIG. 8, such illustrates a fragment of a semiconductor construction 50 at a preliminary processing stage of another embodiment. The illustrated fragment of construction 50 is identical to the fragment 8 of construction 10 discussed above, and accordingly comprises base 12 having opening 18 extending therein.

Construction 50 is exposed to at least one organoaluminum composition 24, under processing similar to that discussed above regarding FIG. 3. The difference between construction 50 of FIG. 8 and the construction 10 at the processing stage of FIG. 3, is that construction 50 may not have been exposed to silanol precursor in some applications (of course, in other applications construction 50 will have been exposed to silanol precursor prior to the processing stage of FIG. 8).

Figure 9:
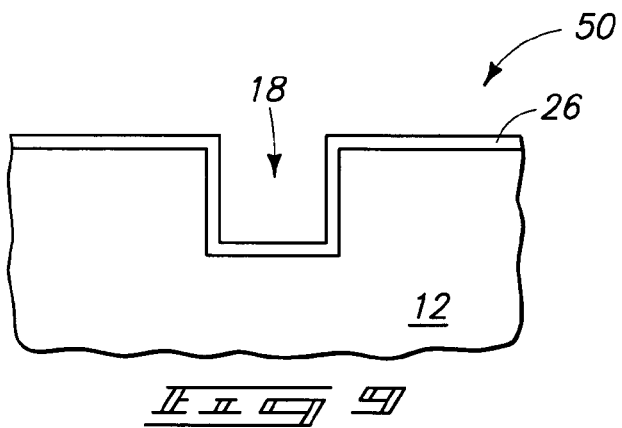
FIG. 9 is a view of the FIG. 8 fragment shown at a processing stage subsequent to that of FIG. 8.

FIG. 9 shows construction 50 after the exposure to the organoaluminum composition to form the organoaluminum-comprising layer 26. The processing of FIGS. 8 and 9 may occur in the reaction chamber 200 described with reference to FIG. 15, and after such processing, unreacted organoaluminum composition may be flushed from the chamber.

FIGS. 10-13 illustrate exposure to silanol 30 and formation of dielectric 32 utilizing alternative processing to that discussed above with reference to FIGS. 5 and 6. Specifically, the processing described with reference to FIGS. 5 and 6 utilized a single large dose of silanol to form the dielectric. In contrast, the processing of FIGS. 10-13 utilizes two separate doses of silanol to form the dielectric.

Figure 10:
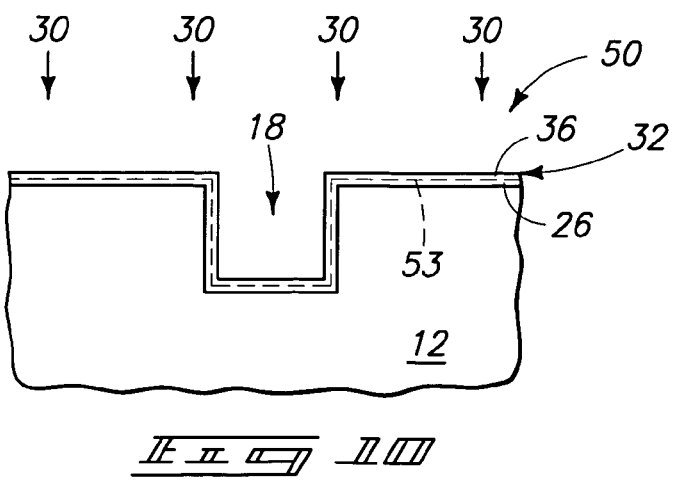
FIG. 10 is a view of the FIG. 8 fragment shown at a processing stage subsequent to that of FIG. 9.

Referring to FIG. 10, a first dose of silanol 30 is provided to initiate formation of dielectric 32. The first dose is shown converting an upper portion of organoaluminum-comprising layer 26 to the dielectric 36 comprising aluminum, silicon and oxygen. A boundary between dielectric 36 and unconverted portions of layer 26 is diagrammatically illustrated with a dashed line 53. The diagram of FIG. 10 is provided to assist the reader in understanding subject matter presented herein. It is to be understood that the first dose may only convert a portion of layer 26 to the dielectric 36 (as shown), or may convert an entirety of layer 26 to dielectric 36 (including applications in which the first dose is sufficient to form a portion of the dielectric 34 discussed above as consisting essentially of, or consisting of silicon and oxygen).

The first dose of silanol 30 may be provided utilizing processing conditions similar to those discussed above regarding FIG. 5. The first dose may be a low amount of silanol provided for a short duration within the deposition chamber. For instance, the first dose may comprise five micromoles of silanol, provided in the deposition chamber volume discussed previously for less than one second (in other words, provided with little to no soak time). However, the quantity of silanol utilized for the first dose, and the duration of exposure utilized for the first dose, may vary to accommodate differing applications. In some applications, the first dose may be conducted with a silanol amount of from about 5 micromoles to about 300 micromoles in the chamber volume discussed previously, with an exposure duration of less than or equal to about 60 seconds.

Figure 11:
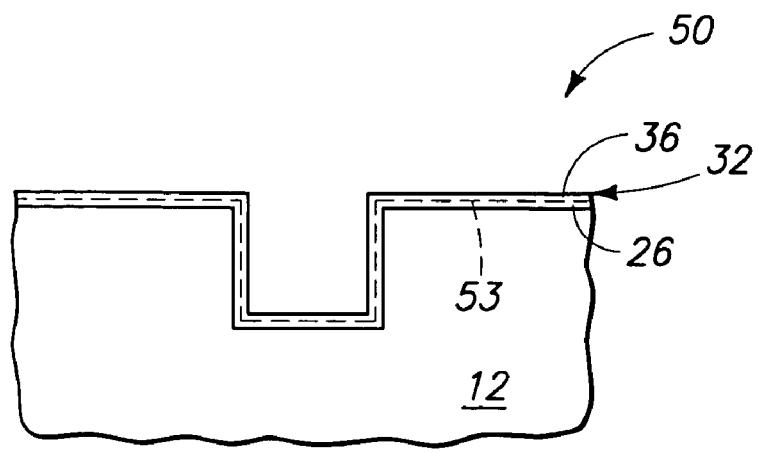
FIG. 11 is a view of the FIG. 8 fragment shown at a processing stage subsequent to that of FIG. 10.
Figure 12:
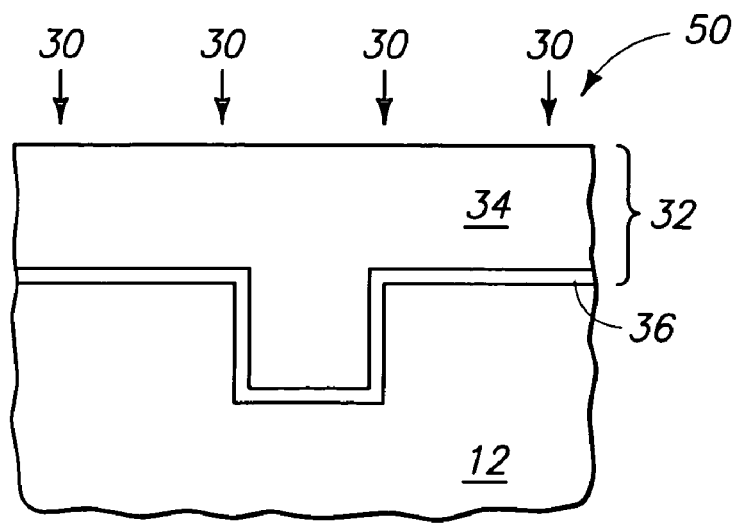
FIG. 12 is a view of the FIG. 8 fragment shown at a processing stage subsequent to that of FIG. 11.
Figure 13:
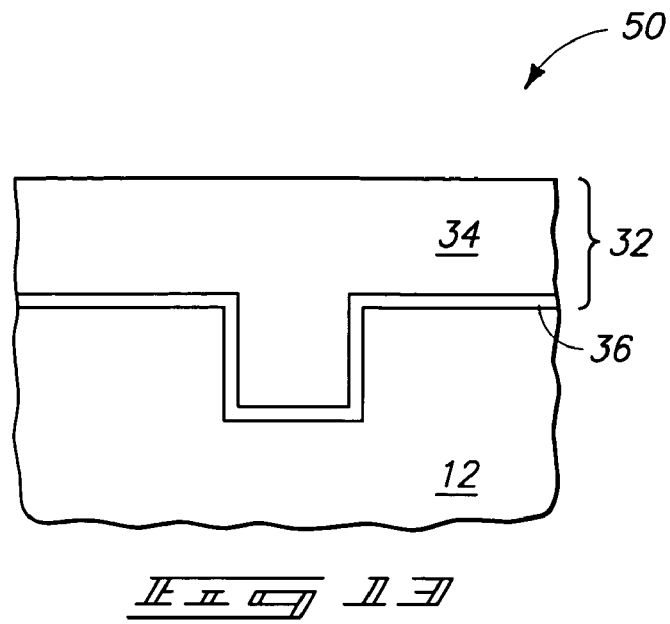
FIG. 13 is a view of the FIG. 8 fragment shown at a processing stage subsequent to that of FIG. 12.

The chamber is flushed (purged) to remove substantially all unreacted silanol of the first dose, leaving the construction of FIG. 11 remaining within the chamber. The term "substantially all" is utilized to indicate that the vast majority of the unreacted silanol is removed from the chamber, which may leave no detectable unreacted silanol within the chamber; which includes, but is not limited to, applications in which the entirety of the unreacted silanol is removed from the chamber. Subsequently, a second dose of silanol 30 is provided within the chamber as shown in FIG. 12 to grow the remainder of dielectric material 32. The second dose is then purged from the chamber to leave the construction of FIG. 13.

Although the second dose is shown using the same silanol 30 as was used for the first dose, it is to be understood that the silanol of the second dose may have one or more silanol compounds that differ from the silanol composition of the first dose, and in some cases may have no silanol compounds in common with the silanol composition of the first dose.

The second dose may utilize a larger amount of silanol for a longer exposure duration than the first dose. For instance, the second dose may utilize 20 micromoles of silanol in the deposition chamber volume discussed above, with a 10 second soak time. The quantity of silanol utilized for the second dose, and the duration of exposure utilized for the second dose, may vary to accommodate differing applications. In some applications the second dose may be conducted with a silanol amount of from about 5 micromoles to about 300 micromoles (such as, for example, from about 5 micromoles to about 100 micromoles) in the chamber volume discussed previously, with an exposure duration of less than or equal to about 120 seconds, (such as, for example, less than or equal to about 60 seconds, and in some applications less than or equal to about 10 seconds).

The splitting of the silanol exposure amongst two separate doses may improve uniformity of dielectric material growth. For instance, it is found that if identical constructions are compared after growth of dielectric material 32, with one of the constructions receiving the silanol split amongst two separate dose and the other receiving the silanol as one large dose, the construction that received the silanol as two separate doses has a uniformity parameter (as measured as range/mean across a semiconductor wafer times 100) of 3.1 percent, whereas the construction that received the silanol as a single large dose has a uniformity parameter of 7.9 percent (with the tested wafers being 200 millimeter wafers). In other words, the silanol pretreatment has provided about a 60% improvement in uniformity of the deposited dielectric material.

A possible mechanism for the improvement achieved by splitting the silanol exposure into two separate doses is that the purging of the deposition chamber after the first dose removes reaction byproducts that otherwise interfere with the overall growth of dielectric material 32. This mechanism is provided to assist the reader in understanding subject matter presented herein, and is not to limit the claims that follow except to the extent, if any, that the mechanism is expressly recited in the claims.

Figure 14:
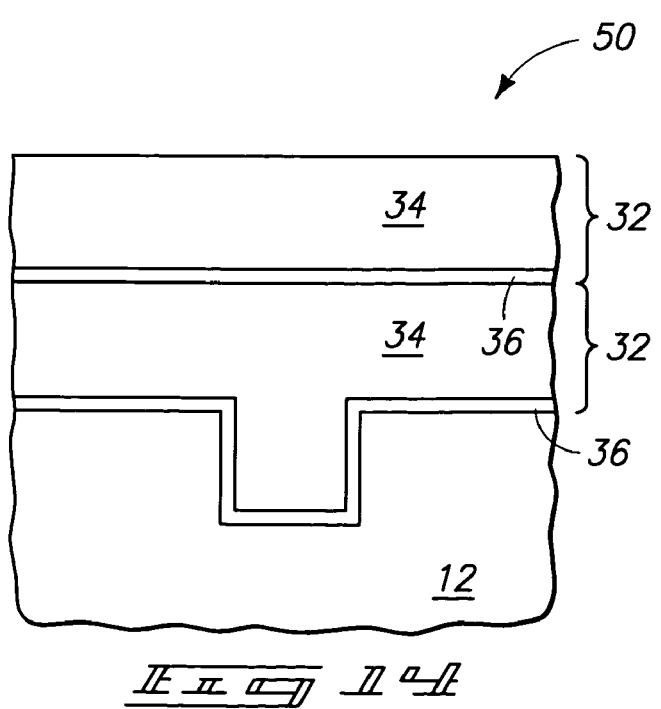
FIG. 14 is a view of the FIG. 8 fragment shown at a processing stage subsequent to that of FIG. 13.

Multiple iterations of the processing of FIGS. 9-13 may be conducted to form a stack of dielectric material 32 over base 12 as shown in FIG. 14.

The processing of FIGS. 8-13 may be combined with that of FIGS. 1-7. Specifically, a silanol pretreatment may be conducted before formation of an organoaluminum-comprising layer, and subsequently aluminum of the organoaluminum may be incorporated into a dielectric formed with silanol provided in two separate steps (with the term "two separate steps" indicating that the silanol is provided in two separate doses which are within a reaction chamber at separate and non-overlapping times relative to one another).

Dielectric materials described above may be utilized for electrically isolating circuitry of semiconductor constructions. The semiconductor constructions having such dielectric material incorporated therein may be utilized in electronic systems, including, for example, computers, cameras, cars, phones, medical instrumentation, etc.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A method of forming a substantially uniform layer of dielectric material across a semiconductor substrate surface, comprising the following sequence in the following order:
   providing the substrate, said substrate surface having at least two different compositions, neither of which comprise metal;
   simultaneously flowing a first silanol and a second silanol over the surface to treat the surface, the first silanol and the second silanol making contact with the surface, the second silanol having a different composition than the first silanol;
   exposing the treated surface to an organoaluminum material to form an organoaluminum-comprising layer across the surface; and
   exposing the organoaluminum-comprising layer to a third silanol.

2. The method of claim 1 further comprising selecting one of the compositions to comprise silicon nitride, and selecting the other to comprise monocrystalline silicon.

3. The method of claim 1 wherein the forming the substantially uniform layer of dielectric material forms the layer to have a uniformity parameter of less than or equal to about 4 percent.

4. The method of claim 1 wherein the substrate surface consists of one of monocrystalline silicon, silicon nitride, silicon dioxide, or silicon oxynitride.

5. The method of claim 1 wherein the organoaluminum-comprising layer consists of carbon, aluminum, and hydrogen.

6. A method of forming dielectric material associated with a semiconductor construction, comprising: simultaneously flowing at least one first silanol and a second silanol over a topography of a semiconductor substrate, wherein the topography comprises at least two different compositions and does not comprise aluminum and the second silanol has a different composition than the first silanol;

after the flowing of the at least one first silanol, exposing the substrate to at least one organoaluminum material to form an organoaluminum-comprising layer across the topography;

after the exposing of the substrate to the at least one organoaluminum material, exposing, via a single exposure, the organoaluminum-comprising layer to at least one third silanol; and forming, as a direct result of the single exposure to the at least one third silanol, a dielectric material comprising aluminum from the organoaluminum-comprising layer together with silicon and oxygen from the at least one third silanol, the dielectric material comprising an upper portion above a lower portion, the upper portion consisting essentially of silicon and oxygen and the lower portion comprising aluminum, silicon, and oxygen.

7. The method of claim 6 wherein the at least two compositions include a first composition and a second composition, and further comprising selecting one of the first and second compositions to comprise monocrystalline silicon.

8. The method of claim 6 wherein the at least two compositions include a first composition and a second composition, and further comprising selecting one of the first and second compositions to comprise silicon nitride.

9. The method of claim 6 wherein the at least two compositions include a first composition and a second composition, and further comprising selecting one of the first and second compositions to comprise silicon nitride, and selecting the other to comprise monocrystalline silicon.

10. The method of claim 6 wherein the exposing to the at least one organoaluminum material comprises exposure to trimethylaluminum.

11. The method of claim 6 wherein the first and third silanols are the same in composition as one another.

12. The method of claim 6 wherein the first and third silanols comprise tris(tert-butoxy) silanol.

13. The method of claim 6 wherein the forming the organoaluminum-comprising layer forms the organoaluminum-comprising layer as a monolayer.

14. The method of claim 6 wherein the upper portion is at least twice as thick as the lower portion, the upper portion is not in direct physical contact with the semiconductor substrate, and the lower portion is in direct physical contact with the semiconductor substrate.

15. The method of claim 6 wherein the upper portion consists of silicon and oxygen.

16. The method of claim 6 wherein the forming of the dielectric material takes place prior to flowing any other metal-containing material over the semiconductor substrate.

17. The method of claim 6 wherein:

the exposing of the organoaluminum-comprising layer to the at least one third silanol comprises flowing an amount of a fluid comprising the at least one third silanol into a deposition chamber containing the semiconductor substrate and sealing the chamber; and the forming of the dielectric material comprises forming the dielectric material as a direct result of the exposure to the amount of the fluid while the chamber is sealed without flowing any other fluid into the chamber.

18. A method of forming dielectric material associated with a semiconductor construction, comprising:

placing a semiconductor substrate within a deposition chamber; the substrate having at least two surfaces of differing composition relative to one another, said at least two surfaces not comprising metal;

simultaneously flowing a first silanol and a second silanol over the surfaces so that the first silanol and the second second silanol make contact with the two surfaces, the second silanol having a different composition than the first silanol; and after the exposure to the first silanol and the second silanol, and while the substrate remains within the deposition chamber, conducting at least one iteration of the following sequence in the following order:

providing an organoaluminum composition within the deposition chamber under conditions sufficient to deposit an organoaluminum-comprising atomic layer across the surfaces; and providing a third silanol within the deposition chamber to form a dielectric material comprising aluminum from the organoaluminum-comprising atomic layer and comprising silicon and oxygen from the third silanol.

19. The method of claim 18 wherein the providing the organoaluminum composition comprises provision of an aluminum alkyl, an aluminum amide or an alkylaluminum alkoxide.

20. The method of claim 18 wherein the first and third silanols are provided to comprise one or more silanols selected from the group consisting of alkoxysilanols, alkoxyalkylsilanols and alkoxysilanediols.

21. The method of claim 18 wherein one of the at least two surfaces comprises monocrystalline silicon, polycrystalline silicon or amorphous silicon.

22. The method of claim 18 wherein one of the at least two surfaces comprises silicon nitride.

23. The method of claim 18 wherein one of the at least two surfaces comprises monocrystalline silicon, polycrystalline silicon or amorphous silicon; and wherein another of the at least two surfaces comprises silicon nitride.

24. The method of claim 18 wherein the providing of the third silanol comprises the following sequence in the following order: injecting a first dose of the third silanol into the chamber;

flushing the first dose from the chamber to remove substantially all unreacted silanol of the first dose from within the chamber; and subsequent to the flushing of the first dose, injecting a second dose of the third silanol into the chamber, there being no injection of aluminum-containing material within the chamber between the injection of the first dose of the third silanol and the injection of the second dose of the third silanol.

25. The method of claim 24 wherein the first dose is within the chamber for a first duration of time, wherein the second dose is within the chamber for a second duration of time, and wherein the second duration is longer than the first duration.

26. The method of claim 25 wherein the second duration is less than or equal to about 10 seconds.

27. The method of claim 26 wherein the first duration is less than or equal to about 1 second.

28. The method of claim 18 further comprising:

purging the deposition chamber of the first silanol prior to the providing of the organoaluminum composition; and purging the deposition chamber of the organoaluminum composition prior to the providing of the third silanol.

29. The method of claim 18 wherein the providing of the third silanol comprises providing the third silanol within the deposition chamber at a higher concentration than the first silanol.

* * * * *

UNITED STATES PATENT AND TRADEMARK OFFICE
CERTIFICATE OF CORRECTION

PATENT NO. : 7,737,047 B2  Page 1 of 1
APPLICATION NO. : 11/510025
DATED : June 15, 2010
INVENTOR(S) : Christopher W. Hill It is certified that error appears in the above-identified patent and that said Letters Patent is hereby corrected as shown below:

In column 10, line 5, in Claim 18, before "silanol" delete "second".

Signed and Sealed this

Seventeenth Day of August, 2010

David J. Kappos
*Director of the United States Patent and Trademark Office*